(12) United States Patent
Yoon et al.

(10) Patent No.: US 8,836,397 B2
(45) Date of Patent: Sep. 16, 2014

(54) DUTY CYCLE RATIO CORRECTION CIRCUIT

(75) Inventors: Dae-Kun Yoon, Gyeonggi-do (KR); Taek-Sang Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 12/240,166

(22) Filed: Sep. 29, 2008

(65) Prior Publication Data

US 2009/0085624 A1    Apr. 2, 2009

(30) Foreign Application Priority Data

Sep. 28, 2007  (KR) .......... 10-2007-0098225
Sep. 10, 2008  (KR) .......... 10-2008-0089271

(51) Int. Cl.
*H03K 3/00* (2006.01)
*H03K 3/017* (2006.01)
*H03K 3/356* (2006.01)

(52) U.S. Cl.
CPC .......... *H03K 3/356104* (2013.01); *H03K 3/017* (2013.01)
USPC ........................................................ 327/199

(58) Field of Classification Search
CPC .............................. H03K 3/012; H03K 3/0375
USPC .......... 327/172–176, 291, 293–296, 298, 299
See application file for complete search history.

(56) References Cited

U.S. PATENT DOCUMENTS

| | | | |
|---|---|---|---|
| 5,973,895 A * | 10/1999 | Ternullo et al. ................. | 361/18 |
| 6,853,225 B2 | 2/2005 | Lee | |
| 6,859,081 B2 | 2/2005 | Hong et al. | |
| 6,963,235 B2 | 11/2005 | Lee | |
| 7,057,431 B2 * | 6/2006 | Kwak ........................... | 327/158 |
| 7,180,346 B2 * | 2/2007 | Lee ............................... | 327/175 |
| 7,298,193 B2 * | 11/2007 | Agarwal et al. .............. | 327/175 |
| 7,304,517 B2 * | 12/2007 | Kim et al. ..................... | 327/175 |
| 7,605,618 B2 * | 10/2009 | Srinivas et al. ............... | 327/108 |
| 2004/0066873 A1 | 4/2004 | Cho et al. | |
| 2006/0091922 A1 * | 5/2006 | Minzoni ....................... | 327/175 |
| 2006/0103441 A1 * | 5/2006 | Carpenter et al. ............ | 327/175 |
| 2006/0197565 A1 | 9/2006 | Kang | |
| 2006/0212739 A1 * | 9/2006 | Boerstler et al. ............. | 713/500 |
| 2009/0115471 A1 * | 5/2009 | Choi ............................. | 327/149 |

FOREIGN PATENT DOCUMENTS

| | | |
|---|---|---|
| JP | 02-198216 | 8/1990 |
| JP | 03-014316 | 1/1991 |
| JP | 08-088545 | 4/1996 |

(Continued)

OTHER PUBLICATIONS

Notice of Preliminary Rejection issued from Korean Intellectual Property Office on Dec. 11, 2009.

(Continued)

*Primary Examiner* — Lincoln Donovan
*Assistant Examiner* — Sibin Chen
(74) *Attorney, Agent, or Firm* — IP & T Group LLP (57) ABSTRACT

A duty ratio correction circuit includes a duty cycle ratio controlling unit configured to generate an internal clock signal having a duty cycle ratio defined according to a first reference clock signal and a reset signal and a reset signal generating unit configured to generate the reset signal in response to a second reference clock signal and the internal clock signal fed back thereto.

9 Claims, 5 Drawing Sheets

(56) References Cited

FOREIGN PATENT DOCUMENTS

| | | |
|---|---|---|
| JP | 11-186882 | 7/1999 |
| JP | 11-330924 | 11/1999 |
| JP | 2002-064366 | 2/2002 |
| JP | 2004-129255 | 4/2004 |
| JP | 2005-318479 | 11/2005 |
| JP | 2007-097182 | 4/2007 |
| JP | 2007-228589 | 9/2007 |
| JP | 2007-242211 | 9/2007 |
| KR | 1019980025443 A | 11/1999 |
| KR | 1020020015181 A | 2/2002 |
| KR | 1020040081529 A | 9/2004 |
| KR | 1020060041458 A | 5/2006 |

OTHER PUBLICATIONS

Notice of Allowance issued by the Japanese Patent Office on May 7, 2013.

Notice of Allowance issued from Korean Intellectual Property Office on Jun. 3, 2010.

Office Action issued by the Japanese Patent Office on Sep. 6, 2012.

C. Svensson, et al., "Impact of Clock Slope on True Single Phase Clocked (TSPC) CMOS Circuits," IEEE Journal of Solid-State Circuits, Jun. 1994, pp. 723-726, vol. 29, No. 6.

* cited by examiner

DUTY CYCLE RATIO CORRECTION CIRCUIT

CROSS-REFERENCES TO RELATED APPLICATION

This application claims priority of Korean patent application numbers 10-2007-0098225 and 10-2008-0089271, filed on Sep. 28, 2007 and Sep. 10, 2008, respectively, which are incorporated by reference in their entireties.

BACKGROUND OF THE INVENTION

The exemplary embodiments of the present invention relate to a semiconductor design technology, and more particularly, to a flip-flop circuit, which is used to generate an output signal synchronized with an input clock signal, and a duty cycle ratio correction circuit, which is used to correct a duty cycle ratio of the input clock signal to 50:50 by using the flip-flop circuit. Throughout the following specification and in the drawing figures the terms "duty ratio" and "duty cycle ratio" are used interchanneably.

Generally, semiconductor devices, including double data rate synchronous DRAM (DDR SDRAM), are under development toward high capacity, high-speed operation, miniaturization, and low power consumption. In an effort to achieve the high-speed operation, a frequency of an external clock signal is increased, and a semiconductor memory device is designed to operate at high speed by generating an internal clock signal in synchronization with the external clock signal. However, there are limitations to increasing the frequency of the external clock signal. To overcome such limitations, methods for increasing the utilization of an external clock signal have been used, with one of them being a double data rate (DDR) scheme.

While a single data rate (SDR) scheme outputs one data, in synchronization with a rising edge of a clock signal, in one cycle of the clock signal, a DDR scheme outputs two data, in synchronization with rising and falling edges of a clock signal, in one cycle of the clock signal. Therefore, when the same external clock signal is input, the DDR scheme has double the data processing ability of the SDRAM scheme.

The DDR scheme seeks to ensure the duty ratio of the clock signal is 50:50 because it outputs the data at the rising and falling edges of the clock signal. If the duty ratio is not 50:50 due to jitter components of the clock signal or other factors, the data output timing becomes distorted and thus the semiconductor memory device cannot ensure a stable data output operation. Therefore, a duty ratio correction circuit is provided inside the semiconductor memory device.

Figure 1:
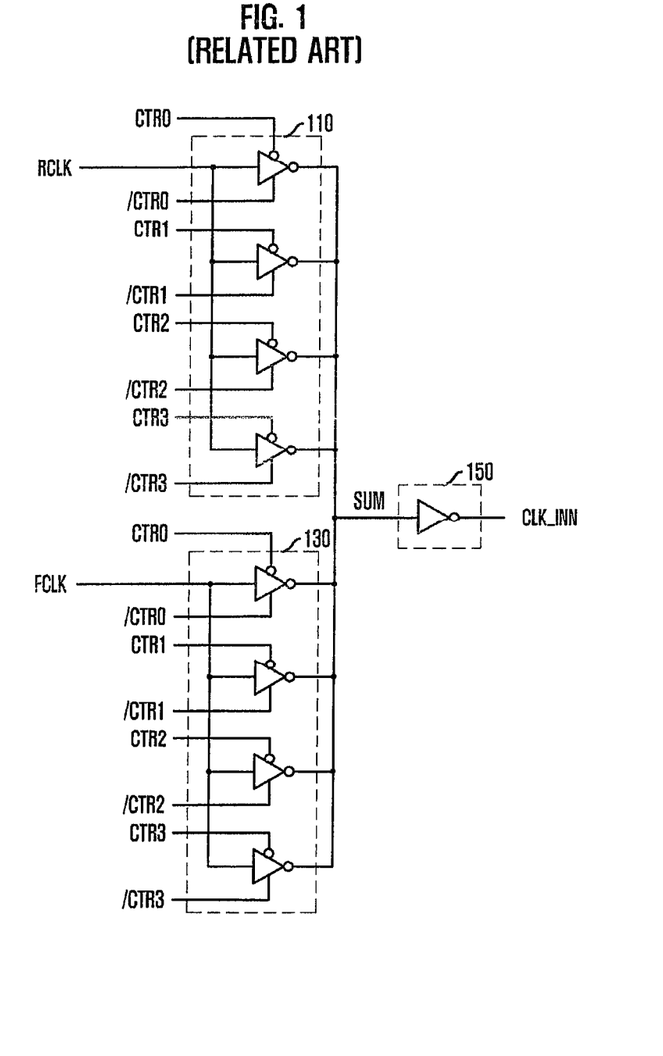
FIG. 1 is a circuit diagram of a conventional duty ratio correction circuit.

FIG. 1 is a circuit diagram of a conventional duty ratio correction circuit.

Referring to FIG. 1, the duty ratio correction circuit includes a first weighting unit 110, a second weighting unit 130, and a clock output unit 150.

The first weighting unit 110 gives a weight to a rising clock signal RCLK, and includes a plurality of inverters respectively configured to be enabled in response to first to fourth weight control signals CTR0 and /CTR0, CTR1 and /CTR1, CTR2 and /CTR2, CTR3 and /CTR3.

The second weighting unit 130 gives a weight to a falling clock signal FCLK, an includes a plurality of inverters respectively configured to be enabled in response to first to fourth weight control signals CTR0 and /CTR0, CTR1 and /CTR1, CTR2 and /CTR2, CTR3 and /CTR3.

The clock output unit 150 receives an output signal generated at a common node SUM to output an internal clock signal CLK_INN.

An operation of the conventional duty ratio correction circuit will be described briefly.

First, the operation of the inverters included in the first weighting unit 110 is opposite to the operation of the inverters included in the second weighting unit 130. In other words, if three inverters of the first weighting unit 110 are enabled, one inverter of the second weighting unit 130 is enabled. If one inverter of the first weighting unit 110 is enabled, three inverters of the second weighting unit 130 are enabled.

The first weighting unit 110 gives a weight to the rising clock signal RCLK and outputs the weighted rising clock signal to the common node SUM, and the second weighting unit 130 gives a weight to the falling clock signal FCLK and outputs the weighted falling clock signal to the common node SUM. The weighted signals output from the first and second weighting units 110 and 130 collide with each other at the common node SUM to generate an internal clock signal CLK_INN with a corrected duty ratio.

As described above, the structure of the conventional duty ratio correction circuit corrects the duty ratio by using the plurality of inverters. The inverters occupy a relatively large area and consume a relatively large amount of current. This frustrates the development of the semiconductor memory device toward low power consumption and miniaturization. In addition, the conventional duty ratio correction circuit has problems due to process, voltage and temperature (PVT) variations, as discussed below.

Figure 2:
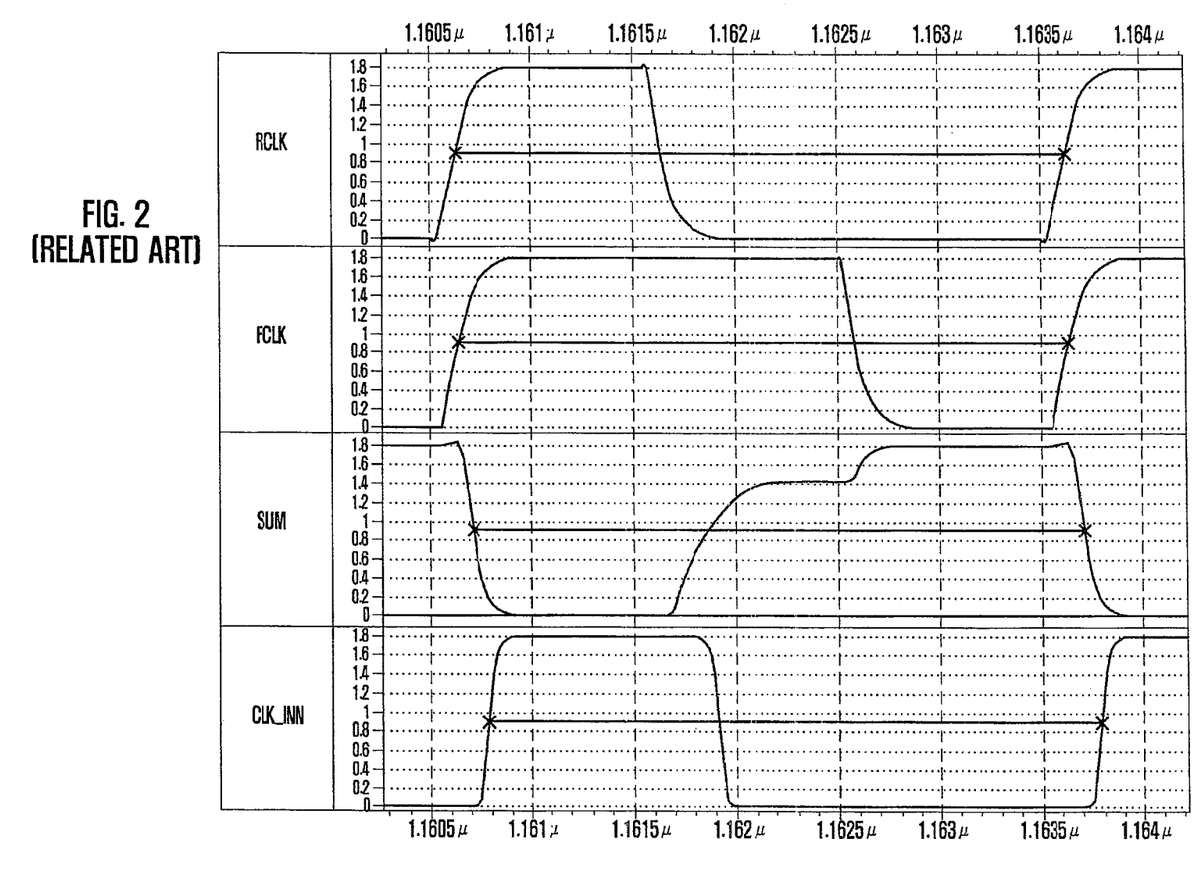
FIG. 2 is a waveform diagram for explaining waveforms of the signals related to the duty ratio correction circuit of FIG. 1.

FIG. 2 is a waveform diagram for explaining waveforms of the signals related to the duty ratio correction circuit of FIG. 1. The rising clock signal RCLK and the falling clock signal FCLK may be distorted according to the PVT variations, as shown by the waveforms of FIG. 2. As shown in FIG. 2, a logic high period of the rising clock signal RCLK may be much shorter than a logic high period of the falling clock signal FCLK.

Generally, a very accurate control is required when weighting the rising clock signal RCLK and the falling clock signal FCLK. If the weight control is inaccurate, a step waveform may be generated at the common node SUM as illustrated in FIG. 2. In this case, the duty ratio of the internal clock signal CLK_INN finally output from the duty ratio correction circuit is slightly corrected compared to the initial rising and falling clock signals RCLK and FCLK, but the duty ratio of 50:50 is not ensured.

Meanwhile, correction of the weight control is achieved by a mask revision after a wafer fab-out. However, the process of mask revision is expensive, and thus the production cost of the semiconductor memory device is raised.

SUMMARY OF THE INVENTION

Embodiments of the present invention are directed to providing a duty ratio correction circuit which is capable of correcting a duty ratio by using an activation edge of an incoming external clock signal.

Embodiments of the present invention are directed to providing a flip-flop circuit which is capable of performing a synchronization operation by making an output node precharged by a power supply voltage in response to a clock signal and a reset signal.

In accordance with an aspect of the present invention, there is provided a flip-flop circuit, comprising a first unit configured to receive a reference clock signal and a reset signal, and a second unit configured to change an output node to a first level in response to the reference clock signal and change the output node to a second level by precharging the output node in response to a signal output from the first unit according to the reset signal.

In accordance with another aspect of the present invention, there is provided a duty ratio correction circuit, comprising a duty ratio controlling unit configured to generate an internal clock signal having a duty ratio defined according to a first reference clock signal and a reset signal, and a reset signal generating unit configured to generate the reset signal in response to a second reference clock signal and the internal clock signal fed back thereto.

In accordance with the embodiments of the present invention, the flip-flop circuit can ensure a more stable flip-flop operation by precharging the output node in response to the clock signal and the reset signal. In addition, the duty ratio correction circuit including the flip-flop circuit can generate the internal clock signal having a desired duty ratio by using the first reference clock signal and the second reference clock signal having a phase difference corresponding to the half period of the first reference clock signal. In particular, since the duty ratio correction circuit reduce the number of required inverters, the area of the semiconductor memory device can be reduced and the power consumption can also be reduced.

DETAILED DESCRIPTION

Hereinafter, an embodiment of the present invention will be described in detail with reference to the accompanying drawings.

Figure 3:
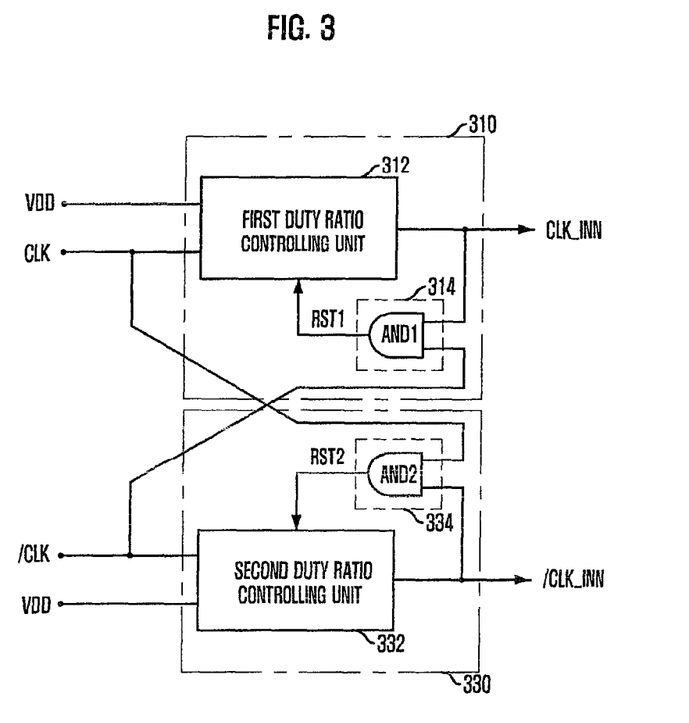
FIG. 3 is a block diagram illustrating a duty ratio correction circuit in accordance with an embodiment of the present invention.

FIG. 3 is a block diagram illustrating a duty ratio correction circuit in accordance with an embodiment of the present invention.

Referring to FIG. 3, the duty ratio correction circuit includes a first internal clock generator 310 and a second internal clock generator 330.

The first internal clock generator 310 receives an external power supply voltage VDD and it is responsive to a positive reference clock signal CLK and a negative reference clock signal /CLK to generate a positive internal clock signal CLK_INN corresponding to the positive reference clock signal CLK. The first internal clock generator 310 includes a first duty ratio controlling unit 312 and a first reset signal generating unit 314.

The first duty ratio controlling unit 312 generates the positive internal clock signal CLK_INN having a duty ratio determined according to an activation edge of the positive reference clock signal CLK and an activation edge of a first reset signal RST1. A detailed circuit configuration illustrating the first duty ratio controlling unit 312 will be described later with reference to FIG. 4.

The first reset signal generating unit 314 generates the first reset signal RST1 in response to the positive internal clock signal CLK_INN and the negative reference clock signal /CLK fed back thereto. The first reset signal generating unit 314 includes a first AND gate AND1 configured to receive the positive internal clock signal CLK_INN and the negative reference clock signal /CLK to output the first reset signal RST1. The first AND gate AND1 outputs a first logic reset signal RST1 which is activated to a logic high level when both the positive internal clock signal CLK_INN and the negative reference clock signal /CLK are activated to a logic high level.

The negative reference clock signal /CLK has a phase difference corresponding to the half period of the positive reference clock signal CLK. The half period means ½ tCK of the positive clock signal CLK.

Figure 4:
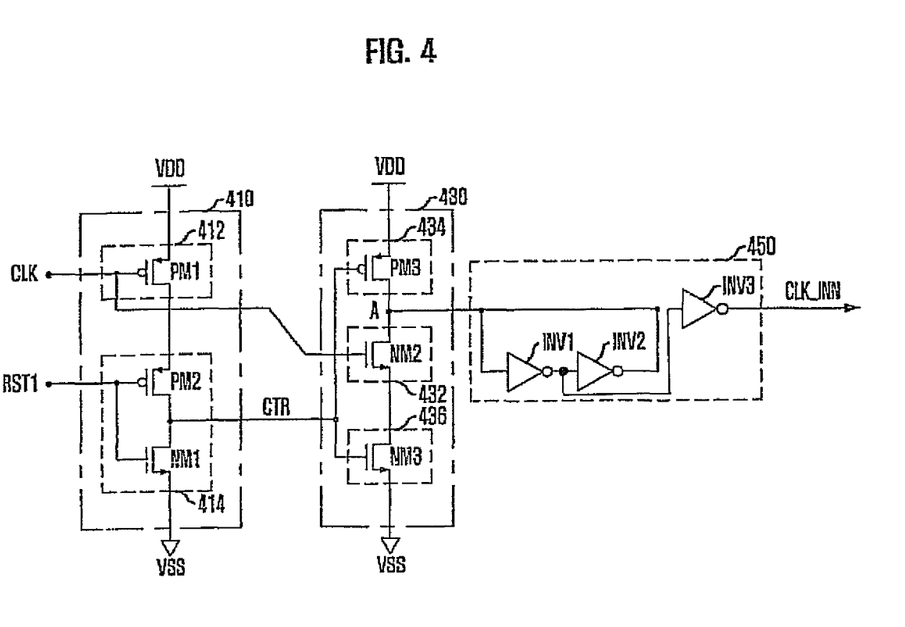
FIG. 4 is a circuit diagram illustrating a first duty ratio controlling unit of FIG. 3.

FIG. 4 is a circuit diagram illustrating the first duty ratio controlling unit 312.

Referring to FIG. 4, the first duty ratio controlling unit 312 includes a first unit 410, a second unit 430, and a latching unit 450.

The first unit 410 is configured to receive the first positive reference clock signal CLK and the first reset signal RST. The first unit 410 includes a first input unit 412 configured to receive the positive reference clock signal CLK, and a second input unit 414 configured to output a control signal CTR for enabling a second driving unit 434 in response to the first reset signal RST1.

More specifically, the first unit 410 includes: a first PMOS transistor PM1 having a source connected to the external power supply voltage (VDD) terminal, and a gate receiving the positive reference clock signal CLK; a second PMOS transistor PM2 having a source connected to a drain of the first PMOS transistor PM1, and a gate receiving the first reset signal RST1; and a first NMOS transistor NM1 having a drain connected to a drain of the second PMOS transistor PM2, a source connected to the ground voltage (VSS) terminal, and a gate receiving the first reset signal RST1. The control signal CTR is output through a common node of the drains of the second PMOS transistor PM2 and the first NMOS transistor NM1.

The second unit 430 changes an output node A to a first level in response to the positive reference clock signal CLK, and changes the output node A to a second level by precharging the external power supply voltage VDD in response to the control signal CTR corresponding to the first reset signal RST. The second unit 430 includes a first driving unit 432 configured to drive the output node A to the ground voltage VSS in response to the positive reference clock signal CLK, and a second driving unit 434 configured to precharge the output node A to the external power supply voltage VDD in response to the control signal CTR. Also, the second unit 430 further includes an enabling unit 436 configured to enable the first driving unit 432 in response to the control signal CTR.

More specifically, the second unit 430 includes: a third PMOS transistor PM3 having a source connected to the external power supply voltage (VDD) terminal, a drain connected to the common node A, and a gate receiving the control signal CTR; a second NMOS transistor NM2 having a drain connected to the output node A, a gate receiving the positive reference clock signal CLK; and a third NMOS transistor NM3 having a drain connected to a source of the second NMOS transistor NM2, a source connected to the ground voltage (VSS) terminal, and a gate receiving the control signal CTR.

The latching unit 450 is configured to latch a signal of the output node A to output the positive internal clock signal CLK_INN synchronized with the positive reference clock signal CLK. The latching unit 450 may include a first inverter INV1 configured to invert the signal of the output node A, a second inverter INV2 configured to invert an output signal of the first inverter INV1 to output the inverted signal to the output node A, and a third inverter INV3 configured to output the signal of the inverter INV1 as the positive internal clock signal CLK_INN.

In the case of a typical flip-flop, a data signal passes through a plurality of gates so that an unwanted delay time is reflected to data. However, since the structure of FIG. 4 uses the power supply voltage, the delay time can be controlled. That is, the high-speed flip-flop operation can be achieved.

Figure 5:
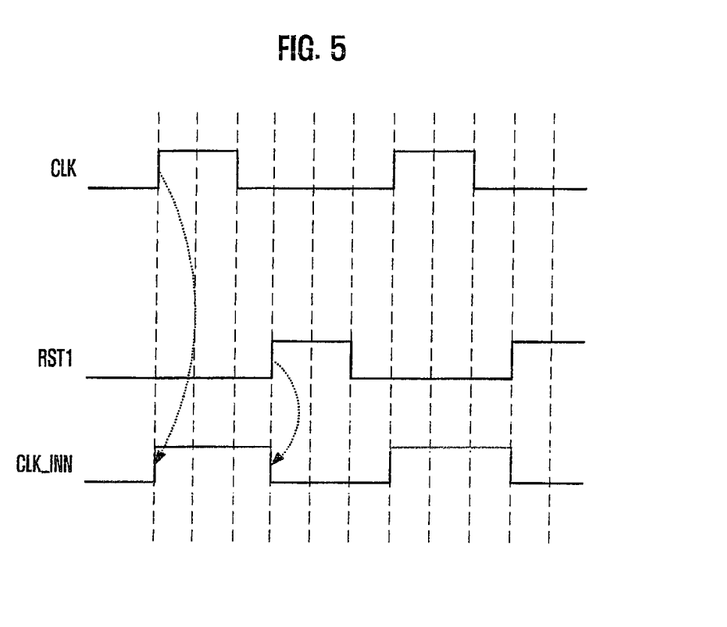
FIG. 5 is a timing diagram illustrating the operation timing of a first duty ratio controlling unit of FIG. 4.

FIG. 5 is a timing diagram illustrating the operation timing of the first duty ratio controlling unit 312 of FIG. 4. In FIG. 5, the positive reference clock signal CLK, the first reset signal RST1, and the positive internal clock signal CLK_INN are illustrated.

Referring to FIGS. 4 and 5, when the positive reference clock signal CLK changes from a logic low level to a logic high level in a state that the first reset signal RST1 is in a logic low state, the second NMOS transistor NM2 is turned on so that the output node A is driven to the ground voltage VSS, that is, a logic low level, and the positive internal clock signal CLK_INN becomes a logic high level. Since he third NMOS transistor NM3 serving as the activating unit 436 has been turned on before the positive reference clock signal CLK changes to a logic high level, the second NMOS transistor NM2 serving as the first driving unit 432 can be activated.

Thereafter, when the first reset signal RST1 changes from a logic low level to a logic high level in response to the negative reference clock signal /CLK, the control signal CTR becomes a logic low level and thus the third PMOS transistor PM3 of the second driving unit 434 is turned on. Therefore, the output node A is precharged to the external power supply voltage VDD and the positive internal clock signal CLK_INN becomes a logic low level.

Consequently, the period where the output node A is maintained at a logic low level may be limited in response to an activation edge of the first reset signal RST1. That is, the output node A can change from a logic low level to a logic high level in response to the first reset signal RST1. The period where the output node A becomes a logic high level may be limited in response to an activation edge of the positive reference clock signal CLK. That is, the output node A can change from a logic high level to a logic low level in response to the positive reference clock signal CLK.

Referring again to FIG. 3, the second internal clock generating unit 330 is configured to receive the external power supply voltage VDD to generate the negative internal clock signal /CLK_INN corresponding to the negative reference clock signal /CLK in response to an activation edge of the negative reference clock signal /CLK and an activation edge of the positive reference clock signal CLK. The second internal clock generating unit 330 includes a second duty ratio controlling unit 332 and a second reset signal generating unit 334.

The second duty ratio controlling unit 332 generates the negative internal clock signal /CLK_INN having the duty ratio defined according to the activation edge of the negative reference clock signal /CLK and the activation edge of the second reset signal RST2. Since the circuit configuration and operation of the second duty ratio controlling unit 332 are similar to those of the first duty ratio controlling unit 312 described with reference to FIGS. 4 and 5, their detailed description will be omitted. However, the second duty ratio controlling unit 332 receives the negative reference clock signal /CLK instead of the positive reference clock signal CLK, and the second reset signal RST2 instead of the first reset signal RST1. In addition, the second duty ratio controlling unit 332 outputs the negative internal clock signal /CLK_INN having a phase opposite to that of the positive internal clock signal CLK_INN. A detailed waveform will be described below with reference to FIG. 6.

Figure 6:
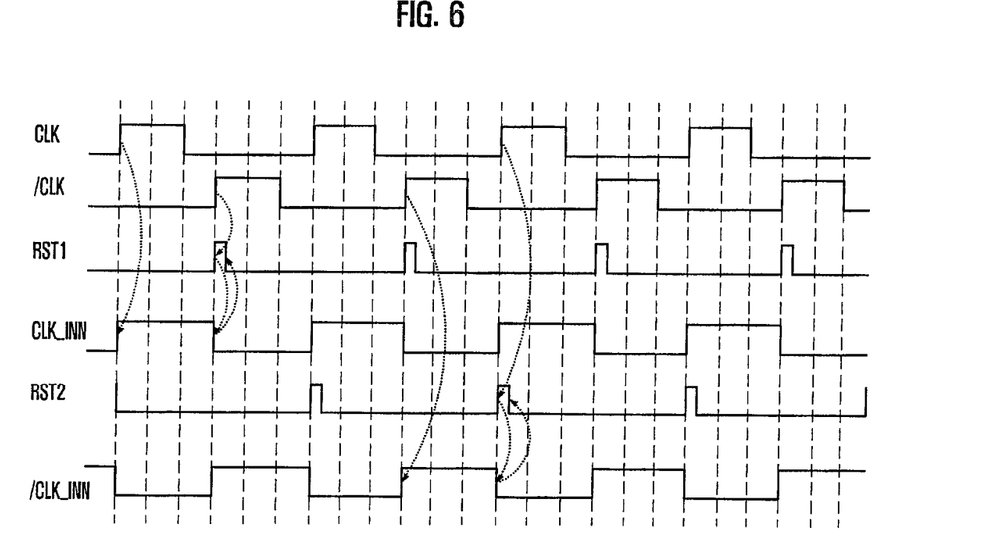
FIG. 6 is a timing diagram illustrating the operation timing of the duty ratio correction circuit of FIG. 3.

FIG. 6 is a timing diagram illustrating the operation timing of the duty ratio correction circuit of FIG. 3, showing the positive reference clock signal CLK, the negative reference clock signal /CLK, the first reset signal RST1, the positive internal clock signal CLK_INN, the second reset signal RST2, and the negative internal clock signal /CLK_INN.

As can be seen from FIGS. 3 and 6, the positive internal clock signal CLK_INN is activated in response to a rising edge of the positive reference clock signal CLK, and is deactivated in response to a rising edge of the first reset signal RST1. The first reset signal RST1 is a signal that is activated in response to a rising edge of the negative reference clock signal /CLK and deactivated in response to a falling edge of the positive internal clock signal CLK_INN. In other words, the positive internal clock signal CLK_INN may change to a logic high level in response to the positive reference clock signal CLK and change to a logic low level in response to the negative reference clock signal /CLK.

The negative internal clock signal/CLK_1NN is activated in response to a rising edge of the negative reference clock signal/CLK, and is deactivated in response to a rising edge of the second reset signal RST2. The second reset signal RST2 is a signal that is activated in response to a rising edge of the positive reference clock signal CLK and deactivated in response to a falling edge of the negative internal clock signal/CLK_INN. In other words, the negative internal clock signal/CLK_INN may change to a logic high level in response to the negative reference clock signal/CLK and change to a logic low level in response to the positive reference clock signal CLK.

Consequently, the positive internal clock signal CLK_INN can be corrected to the duty ratio to 50:50 in correspondence with the positive reference clock signal CLK, and the negative internal clock signal /CLK_INN can be corrected to the duty ratio to 50:50 in correspondence with the negative reference clock signal /CLK. As can be seen from FIG. 6, the positive internal clock signal CLK_INN and the negative internal clock signal /CLK_INN have opposite phases.

The conventional duty ratio correction circuit causes various problems because the duty ratio of the internal clock signal is corrected by giving weights to the plurality of inverters. However, the duty ratio correction circuit in accordance with the embodiment of the present invention adopts a new structure instead of the plurality of inverters, and thus generates the internal clock signal having a desired duty ratio without weight control. Therefore, the duty ratio correction circuit in accordance with the above embodiment of the present invention can solve the problems caused by the inverters and the weight control.

As described above, the duty ratio correction circuit in accordance with the above embodiment of the present invention can operate fast and generate the internal clock signal having a desired duty ratio by using the flip-flop circuit, thereby increasing the operating speed of the semiconductor memory device. The reliability of data output can be increased because the data output from the semiconductor memory device is properly synchronized with the rising and falling edges of the external clock signal. In addition, since the number of inverters used in the conventional duty ratio correction circuit is reduced, the area of the semiconductor memory device can be reduced and the power consumption can be reduced. Furthermore, the semiconductor memory device can be operated insensitively to the PVT variations. Moreover, cost can be reduced because it is unnecessary to perform the mask revision operation after the wafer fab-out in order to correct the duty ratio correction.

While the present invention has been described with respect to the specific embodiments, it will be apparent to those skilled in the art that various changes and modifications may be made without departing from the spirit and scope of the invention as recited in the following claims.

What is claimed is:

1. A duty cycle ratio correction circuit, comprising:
   a duty cycle ratio controlling unit configured to generate an internal clock signal having a duty cycle ratio defined according to a first reference clock signal and a reset signal; and
   a reset signal generating unit configured to generate the reset signal in response to a second reference clock signal and the internal clock signal fed back thereto,
   wherein the duty cycle ratio controlling unit includes:
      a first unit configured to receive the first reference clock signal and the reset signal, and to output a control signal in response to the reset signal; and
      a second unit configured to receive the first reference clock signal and the control signal outputted from the first unit, to change an output node to a first level in response to the first reference clock signal and to change the output node to a second level by precharging the output node in response to the control signal,
   wherein the second unit comprises:
      a first driving unit configured to drive the output node to the first level in response to the first reference clock signal;
      a second driving unit configured to precharge the output node to the second level in response to the reset signal; and
      an enabling unit configured to enable the first driving unit in response to the control signal.

2. The duty cycle ratio correction circuit as recited in claim 1, wherein the second reference clock signal has a phase difference corresponding to a half period of the first reference clock signal.

3. The duty cycle ratio correction circuit as recited in claim 1, wherein the internal clock signal is activated in response to the first reference clock signal and deactivated in response to the reset signal.

4. The duty cycle ratio correction circuit as recited in claim 1, wherein the reset signal is activated when both the second reference clock signal and the internal clock signal are activated.

5. The duty cycle ratio correction circuit as recited in claim 1, wherein the duty cycle ratio controlling unit further comprises a latching unit configured to latch a signal of the output node to output the internal clock signal synchronized with the first reference clock signal.

6. The duty cycle ratio correction circuit as recited in claim 5, wherein the first unit comprises:
   a first MOS transistor having a source connected to a first voltage terminal, and a gate receiving the first reference clock signal;
   a second MOS transistor having a source connected to a drain of the first MOS transistor, and a gate receiving the reset signal; and
   a third MOS transistor having a drain connected to the drain of the second MOS transistor, a source connected to a second voltage terminal, and a gate receiving the reset signal, and
   wherein the second unit comprises:
      a fourth MOS transistor having a source connected to the first voltage terminal, a drain connected to the output node, and a gate connected to a common node of the second MOS transistor and the third MOS transistor;
      a fifth MOS transistor having a drain connected to the output node, and a gate receiving the first reference clock signal; and
      a sixth MOS transistor having a drain connected to a source of the fifth MOS transistor, a source connected to the second voltage terminal, and a gate connected to the common node.

7. The duty cycle ratio correction circuit as recited in claim 1, wherein a period where the output node is maintained at the first level is limited in response to an activation edge of the reset signal, and a period where the output node is precharged to the second level is limited in response to an activation edge of the first reference clock signal.

8. The duty cycle ratio correction circuit as recited in claim 1, wherein the second level corresponds to a power supply voltage, and the first level corresponds to a ground voltage.

9. The duty cycle ratio correction circuit as recited in claim 1, wherein the first unit comprises:
   a first input unit configured to receive the first reference clock signal; and
   a second input unit configured to receive the reset signal to output the control signal for controlling the second driving unit.

* * * * *